(12) United States Patent
Barber et al.

(10) Patent No.: US 6,323,744 B1
(45) Date of Patent: Nov. 27, 2001

(54) GROUNDING OF TFR LADDER FILTERS

(75) Inventors: Bradley Paul Barber, Chatham; Michael George Zierdt, Belle Mead, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/498,472

(22) Filed: Feb. 4, 2000

(51) Int. Cl.$^7$ ............................... H03H 9/54; H03H 9/56
(52) U.S. Cl. ............................... 333/189; 333/191
(58) Field of Search .................. 333/186–192; 310/311, 312, 321, 366

(56) References Cited

U.S. PATENT DOCUMENTS 3,222,622 * 12/1965 Curran et al. .................. 333/192
4,502,932     3/1985 Kline et al. ..................... 204/192 EC (List continued on next page.)

FOREIGN PATENT DOCUMENTS 7-264000 * 10/1995 (JP).

OTHER PUBLICATIONS

C.W. Seabury et al., "Thin Film ZnO Based Bulk Acoustic Mode Filters", *IEEE MTT–S Microwave Symposium Digest, 1997*; Jun., 1997, vol. 1, pp. 181–184.*

*Primary Examiner*—Robert Pascal
*Assistant Examiner*—Barbara Summons

(57) ABSTRACT

A TFR ladder filter which may yield less degradation in the stopband near the passband edges than conventionally grounded TFR ladder filters. Each of the plurality of shunt-coupled TFR elements of the ladder filter has its own dedicated ground path which is to connected to a final ground external from the ladder filter, so that each shunt-coupled TFR element is individually isolated from one another. Particularly, each shunt-coupled TFR element has a corresponding wirebond to individually connect its top metal ground electrode to a final external ground of a carrier or package on which the die encompassing the TFR ladder filter rests.

17 Claims, 6 Drawing Sheets

U.S. PATENT DOCUMENTS

| | | | |
|---|---|---|---|
| 4,556,812 | 12/1985 | Kline et al. | 310/324 |
| 4,719,383 | 1/1988 | Wang et al. | 310/324 |
| 4,890,370 | 1/1990 | Fukuda et al. | 29/25.35 |
| 4,988,957 | 1/1991 | Thompson et al. | 331/107 A |
| 5,075,641 | 12/1991 | Weber et al. | 331/108 C |
| 5,166,646 | 11/1992 | Avanic et al. | 331/107 A |
| 5,231,327 * | 7/1993 | Ketcham | 333/189 X |
| 5,232,571 | 8/1993 | Braymen | 204/192.22 |
| 5,263,259 | 11/1993 | Cimador | 33/41.4 |
| 5,283,458 | 2/1994 | Stokes et al. | 257/416 |
| 5,294,898 * | 3/1994 | Dworsky et al. | 333/189 X |
| 5,303,457 | 4/1994 | Falkner, Jr. et al. | 29/25.35 |
| 5,334,960 | 8/1994 | Penunuri | 333/193 |
| 5,348,617 | 9/1994 | Braymen | 156/644 |
| 5,367,308 | 11/1994 | Weber | 343/700 MS |
| 5,373,268 | 12/1994 | Dworsky et al. | 333/187 |
| 5,381,385 | 1/1995 | Greenstein | 367/140 |
| 5,403,701 | 4/1995 | Lum et al. | 430/315 |
| 5,404,628 | 4/1995 | Ketcham | 29/25.35 |
| 5,438,554 | 8/1995 | Seyed-Bolorforosh et al. | 367/140 |
| 5,446,306 | 8/1995 | Stokes et al. | 257/416 |
| 5,552,655 | 9/1996 | Stokes et al. | 310/330 |
| 5,587,620 | 12/1996 | Ruby et al. | 310/346 |
| 5,596,239 | 1/1997 | Dydyk | 310/311 |
| 5,617,065 | 4/1997 | Dydyk | 333/186 |
| 5,630,949 | 5/1997 | Lakin | 216/61 |
| 5,646,583 | 7/1997 | Seabury et al. | 333/187 |
| 5,692,279 | 12/1997 | Mang et al. | 29/25.35 |
| 5,698,928 | 12/1997 | Mang et al. | 310/322 |
| 5,702,775 | 12/1997 | Anderson et al. | 428/1 |
| 5,714,917 | 2/1998 | Ella | 332/144 |
| 5,760,663 | 6/1998 | Pradal | 333/187 |
| 5,780,713 | 7/1998 | Ruby | 73/1.82 |
| 5,789,845 * | 8/1998 | Wadaka et al. | 310/311 X |
| 5,821,833 | 10/1998 | Lakin | 333/187 |
| 5,853,601 | 12/1998 | Krishawamy et al. | 216/2 |
| 5,864,261 | 1/1999 | Weber | 333/187 |
| 5,872,493 * | 2/1999 | Ella | 333/191 |
| 5,873,153 | 2/1999 | Ruby et al. | 29/25.35 |
| 5,873,154 | 2/1999 | Ylilammi et al. | 29/25.35 |
| 5,883,575 | 3/1999 | Ruby et al. | 340/572.5 |
| 5,884,378 | 3/1999 | Dydyk | 29/25.35 |
| 5,894,647 | 4/1999 | Lakin | 29/25.35 |
| 5,910,756 * | 6/1999 | Ella | 333/189 X |
| 5,928,598 | 7/1999 | Anderson et al. | 264/446 |
| 5,942,958 * | 8/1999 | Lakin | 333/189 |
| 5,945,893 * | 8/1999 | Plessky et al. | 333/195 |
| 5,963,856 | 10/1999 | Kim | 455/307 |
| 6,051,907 | 4/2000 | Ylilammi | 310/312 |
| 6,060,818 | 5/2000 | Ruby et al. | 310/363 |
| 6,081,171 | 6/2000 | Ella | 333/189 |
| 6,087,198 | 7/2000 | Panasik | 438/51 |
| 6,127,768 | 10/2000 | Stoner et al. | 310/313 A |
| 6,150,703 | 11/2000 | Cushman et al. | 257/415 |
| 6,185,589 | 2/2001 | Votipka | 707/517 |
| 6,198,208 | 3/2001 | Yano et al. | 310/358 |
| 6,204,737 | 3/2001 | Ella | 333/187 |
| 6,215,375 | 4/2001 | Larson, III et al. | 333/187 |

\* cited by examiner

GROUNDING OF TFR LADDER FILTERS

FIELD OF THE INVENTION

The present invention relates to grounding of thin film resonator (TFR) ladder filters.

DESCRIPTION OF THE RELATED ART

Thin film resonators (hereinafter "TFR") are typically used in high-frequency environments ranging from several hundred megahertz (MHz) to several gigahertz (GHz). FIG. 1 illustrates the general cross-section of a conventional TFR component 100. In FIG. 1, TFR component 100 includes a piezoelectric material 110 interposed between two conductive electrode layers 105 and 115, with electrode layer 115 which may be formed on a membrane or sets of reflecting layers deposited on a solidly mounted semiconductor substrate 120 which may be made of silicon or quartz, for example. The piezoelectric material is typically a dielectric, preferably one selected from the group comprising at least ZnO, CdS and AlN. Electrode layers 115 and 105 are formed from a conductive material, preferably of Al, but may be formed from other conductors as well.

These TFR components are often used in electrical signal filters, more particularly in TFR filters applicable to a myriad of communication technologies. For example, TFR filters may be employed in cellular, wireless and fiber-optic communications, as well as in computer or computer-related information-exchange or information-sharing systems.

The desire to render these increasingly complicated communication systems portable and even hand-held place significant demands on filtering technology, particularly in the context of increasingly crowded radio frequency resources. TFR filters must meet strict performance requirements which include: (a) being extremely robust, (b) being readily mass-produced and (c) being able to sharply increase performance to size ratio achievable in a frequency range extending into the gigahertz region. However, in addition to meeting these requirements, there is a need for low passband insertion loss simultaneously coupled with demand for a relatively large stopband attenuation. Moreover, some of the typical applications noted above for these TFR filters require passband widths up to 4% of the center frequency, which is not easily achieved using common piezoelectrics such as AlN.

A standard approach to designing TFR filters out of resonators is to arrange them in a ladder configuration alternately in a series-shunt relationship (i.e., a "shunt" resonator connected in shunt at a terminal of a "series" resonator). Currently, the conventional way of designing TFR ladder filters is to design simple building blocks of TFR components which are then concatenated together (connected or linked up in a series or chain). FIG. 2 illustrates a simple building block in circuit form, commonly known as a T-Cell. Referring specifically to FIG. 2, a T-Cell 125 includes three TFR components 130A, 130B and 135. TFRs 130A and 130B each are "series arm" portions of the T-Cell block. They are connected in series between an input port 132 and node 136, and node 136 to an output port 134 of T-Cell building block 125. Further, TFR components 130A or 130B may be part of a series arm for an adjacently connected T-Cell, as will be shown later. Resonator element 135 comprises the "shunt leg" portion of T-Cell building block 125, being connected in shunt between terminal 136 and ground. A plurality of these T-Cells 125 chained together form a TFR ladder filter.

FIGS. 3A and 3B illustrate ideal and conventional grounding patterns for TFR ladder filters. Ideally, TFR ladder filters would like to see perfect isolated grounds paths from each of is shunt legs to the final external ground of a package or carrier that the die rests on, so that there are no avenues of feedback or coupling between the shunt resonators. The die is an integral base on which the individual serially and shunt-coupled TFR components of the ladder filter are fabricated on (i.e., the semiconductor substrate of FIG. 1, for example). The die typically rests upon or is situated within a carrier or package. Such an ideal grounding arrangement is illustrated by the TFR ladder filter circuit 150 shown between input port 149 and output port 151 of FIG. 3A. As shown in FIG. 3A, shunt TFR elements 152 and 153 are directly grounded to the final external ground 155 of a carrier or package. Since all of the ground nodes of the ladder filter are top electrodes and are usually grouped next to each other, it is common practice to tie all the grounds together into one large ground pad, or "bus", and then wirebond this pad to the final package ground with one or more wirebonds. Such a grounding arrangement is illustrated in FIG. 3B. In FIG. 3B, the die grounds of shunt elements 162 and 163 of TFR ladder filter 160 are "tied" together to form a single metal strip 164 (i.e., a common die ground from the top metal electrodes) which is connected to the final external ground 166 on the carrier by wirebond 165. Although this provides somewhat adequate grounding, there is significant degradation of ladder filter performance in the stopband near the passband edges, due to the aforementioned coupling or feedback between the shunt resonators caused by this common die bus.

These stopband performance "glitches" near the passband of a TFR ladder filter can be somewhat minimized by adding multiple wirebonds. FIG. 4A illustrates a simplified view of a TFR ladder filter circuit using multiple wirebonding, and FIG. 4B depicts a three-dimensional physical representation of the multiple wirebond arrangement of FIG. 4A. In FIG. 4A, the TFR ladder filter 200 consists of two T-cells 205 and 215 concatenated together, T-cell 205 having serially-coupled TFR elements 207 and 209 and shunt TFR element 210, T-cell 215 having serially coupled TFR elements 217 and 219 and shunt TFR element 220. Similar to FIG. 3B, the die grounds of the shunt TFR elements 210 and 220 are tied together to form a single metal strip 230; however, instead of a single wirebond, two wirebonds 225 and 235 connect the common die ground to the final external ground of the carrier or package (not shown).

FIG. 4B is a three-dimensional physical representation of the TFR ladder filter 200 of FIG. 4A. Specifically, in die 250 there is shown the arrangement of top and bottom metal electrodes corresponding to the TFR elements in T-cells 205 and 215 of FIG. 4A, as well as the wirebond connections to the final external ground. Specifically, top electrodes 255 and 265 correspond to series TFR elements 207 and 219, top electrode 260 represents a common top metal electrode for series TFR elements 209 and 217, and top metal electrode 270 is a common die ground electrode for shunt TFR elements 210 and 220 (analogous to the singular metal strip 230 connecting the shunt TFR elements of the ladder filter 200). Connectors 281 and 282 connect the TFR ladder filter to other components adjacent thereto within a particular system (not shown). Bottom electrodes 280 and 290 are common to respective TFR elements in T-cells 205 and 215 respectively. As can be seen from FIG. 4B, two wirebonds 295A and 295B (corresponding to wirebonds 225 and 235 in FIG. 4A) are for connecting the common die ground electrode of the adjacent TFR shunt elements to the final external ground on a carrier or package that the die rests on (not shown).

The use of multiple wirebonds somewhat improves the stopband glitches near the passband edges of the TFR ladder filter, as compared to using the single wirebond shown in FIG. 3B. This is because by increasing the number of wirebonds to a final external ground, the overall inductance and resistance is lowered, which in turn helps to isolate the common die bus from the final package ground. This somewhat limits the deteriorating effects due to the feedback/coupling phenomena. However, the improvement is still unacceptable when compared to the response achievable by employing an ideal grounding arrangement as illustrated in FIG. 3A. Accordingly, there is a need for a TFR ladder filter having a wirebond grounding arrangement which yields superior filter performance than the aforementioned standard grounding techniques.

SUMMARY OF THE INVENTION

The present invention provides a TFR ladder filter which may yield less degradation in the stopband near the passband edges than conventionally grounded TFR ladder filters. Each of the plurality of shunt-coupled TFR elements of the ladder filter has its own dedicated ground path which is to be connected to a final external ground on the package or carrier on which the die of the ladder filter rests. Thus, each shunt-coupled TFR element is individually isolated from one another, reducing the feedback/coupling effects prevalent in filters with common die grounds.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein.

DETAILED DESCRIPTION

An embodiment of the present invention is directed to a thin film resonator ladder filter which provides improved performance in the stopband near the passband edges by providing a dedicated final external ground path for each shunt-coupled TFR element in the ladder filter, so that each shunt-coupled TFR element is individually isolated from one another. Stopband performance glitches near the passband are significantly reduced, as compared to the single and multiple wirebond grounding arrangements currently used in grounding a TFR ladder filter to the carrier or package on which it rests.

Figure 4A:
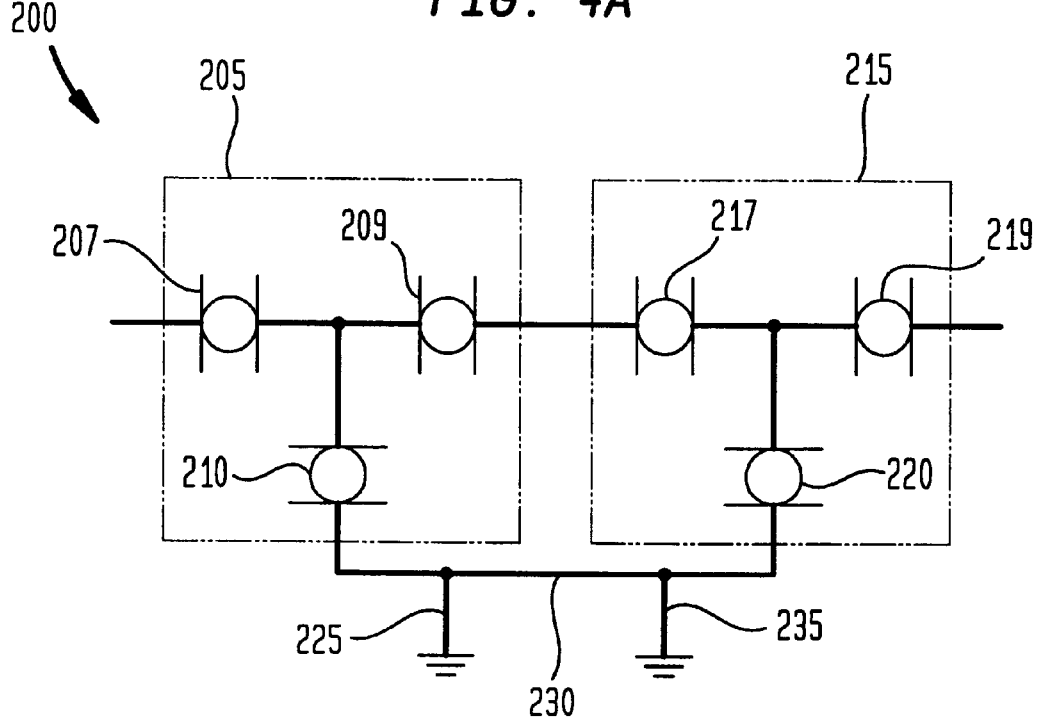
FIG. 4A illustrates a TFR ladder filter circuit with a multiple wirebond grounding arrangement.
Figure 4B:
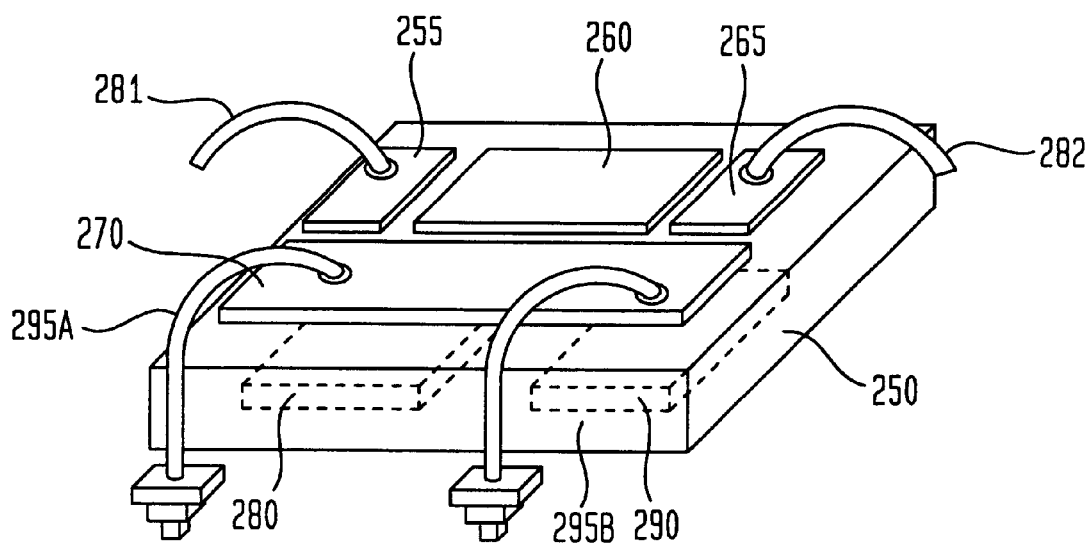
FIG. 4B is a three-dimensional representation of the TFR ladder filter circuit of FIG. 4A.
Figure 5A:
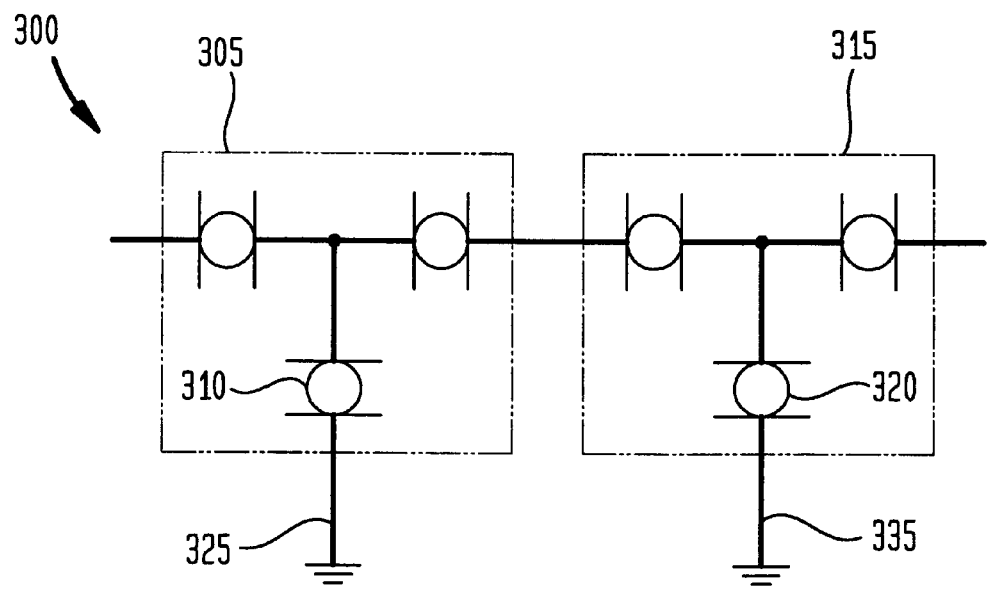
FIG. 5A illustrates a TFR ladder filter circuit with wirebond grounding arrangement in accordance with the present invention.
Figure 5B:
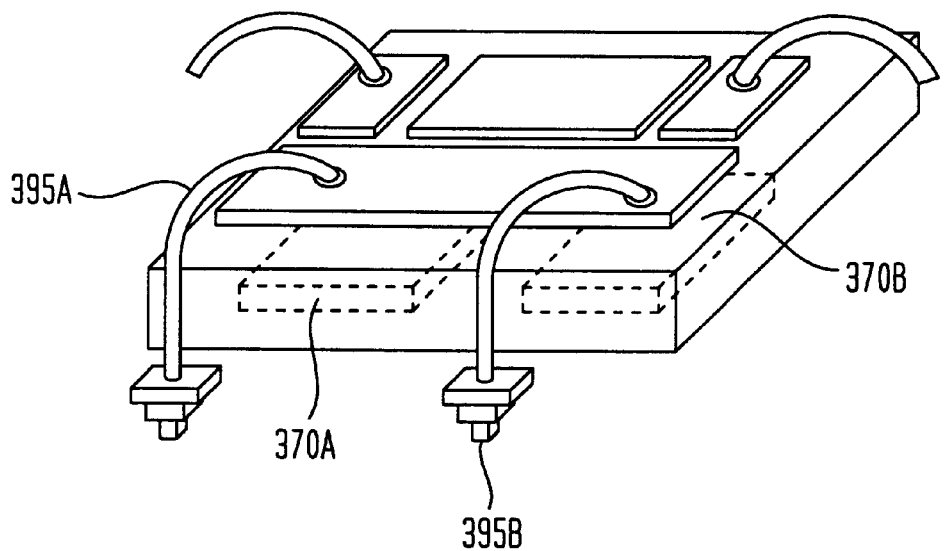
FIG. 5B is a three-dimensional representation of the TFR ladder filter circuit of FIG. 5A.

FIG. 5A illustrates a TFR ladder filter circuit with a wirebond grounding arrangement in accordance with the present invention; and FIG. 5B is a three-dimensional representation of the TFR ladder filter circuit of FIG. 5A. The elements of FIGS. 5A and 5B are almost identical to those previously identified in FIGS. 4A and 4B, so only those differences from the multiple wirebond arrangement discussed in FIGS. 4A and 4B are emphasized.

In FIG. 5A, the die grounds of shunt TFR elements 310 and 320 of TFR ladder filter 300 are not tied together to form a single metal strip (common die ground). Instead, the die grounds of each of the adjacent shunt TFR elements are purposefully isolated from one another, with each shunt leg having its own wirebond path to an external package or carrier ground. (See wirebonds 325 and 335 respectively). As will be evident below, providing a dedicated ground path for each shunt-coupled TFR element in the ladder filter enables the TFR ladder filter to better control parasitic stopband glitches near the passband, as compared to conventional single or multiple wirebonding from a single common die ground to an external ground of a carrier or package.

FIG. 5B is a three-dimensional physical representation of the TFR ladder filter 300 of FIG. 5A. Specifically, in die 350 there is shown the arrangement of top and bottom metal electrodes corresponding to the TFR elements in T-cells 305 and 315 of FIG. 5A, as well as the wirebond connections to an external ground. Specifically, and unlike FIG. 4B, there is no common die ground bus electrode for shunt TFR elements 310 and 320. Instead, each shunt TFR element has its own top ground electrode 370A and 370B, as well as a corresponding wirebond 395A and 395B. Accordingly, each TFR element of the filter is isolated from each other on die 350, and also is individually grounded to the final external package or carrier ground with its own dedicated wirebond path.

Figure 6:
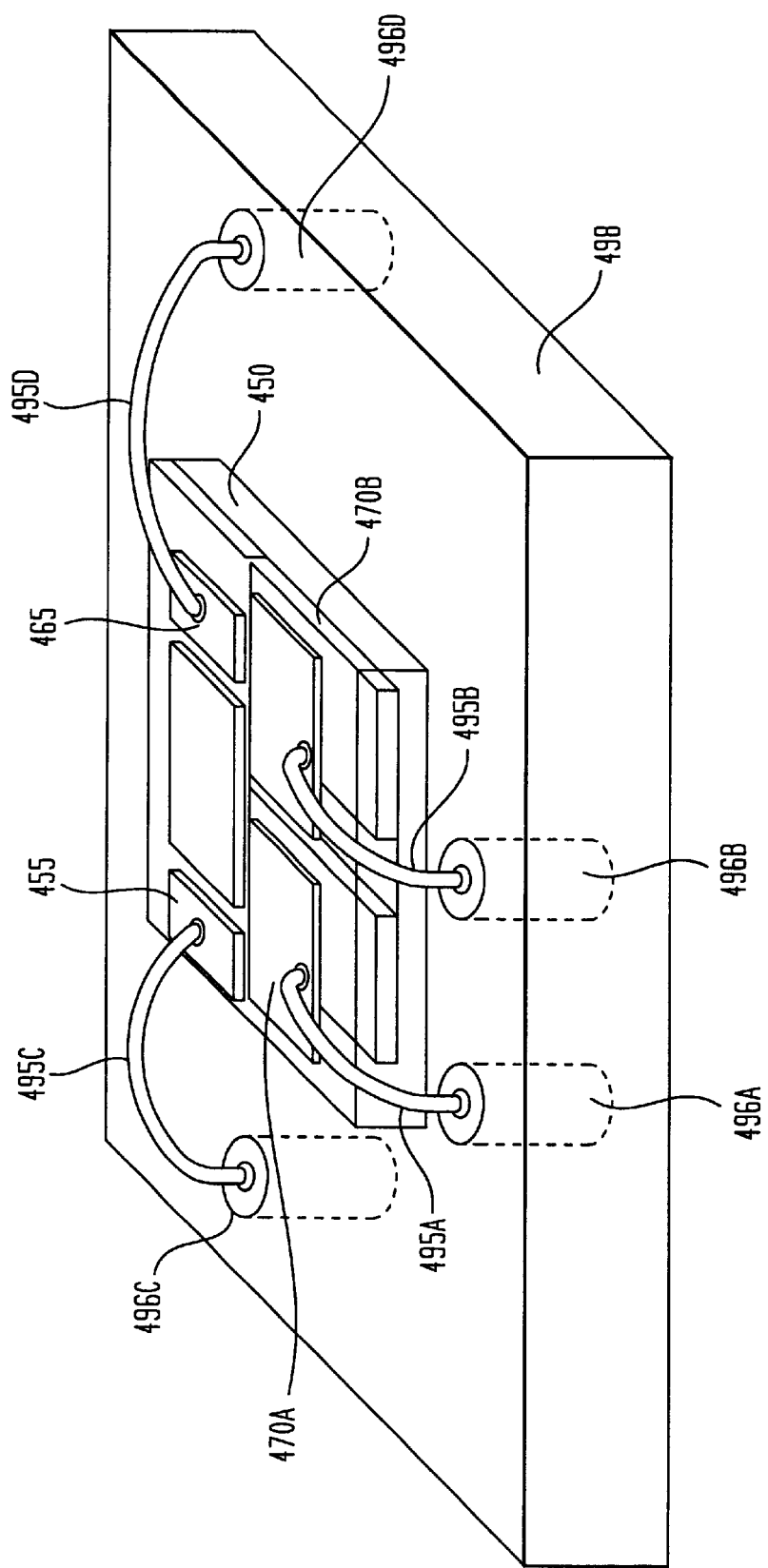
FIG. 6 illustrates an embodiment of the invention as connected to an external final ground of a carrier.

FIG. 6 illustrates an embodiment of the invention as connected to an external ground of a carrier. In FIG. 6, the TFR ladder filter 400 is composed of a plurality of T-Cells concatenated together, and illustrates a plurality of adjacent shunt TFR elements 470A and 470B (designated by their top metal die ground electrodes for convenience) isolated from each other atop die 450. Additionally, each shunt TFR element 470A and 470B has a corresponding wirebond 495A and 495B individually connecting its top shunt electrode by way of a corresponding via 496A and 496B to the final package or carrier ground (not shown in FIG. 6 but beneath die 450, for example. Further, FIG. 6 depicts wirebonds 495C and 495D which serve as input and output ports, connecting top electrodes 455 and 465 of the series TFR elements to the carrier or package by way of corresponding vias 496C and 496D. Therefore, the embodiment of FIGS. 5B and 6 may yield superior stopband performance near the passband edge as compared to TFR ladder filters utilizing conventional grounding arrangements.

Figure 1:
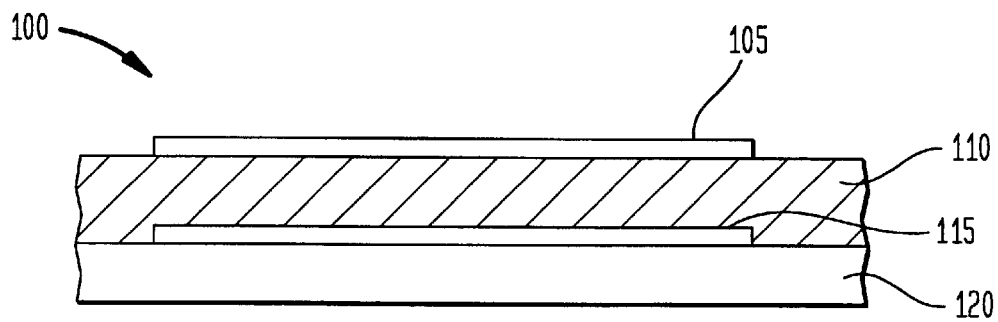
FIG. 1 is a side view of a conventional thin film resonator.
Figure 2:
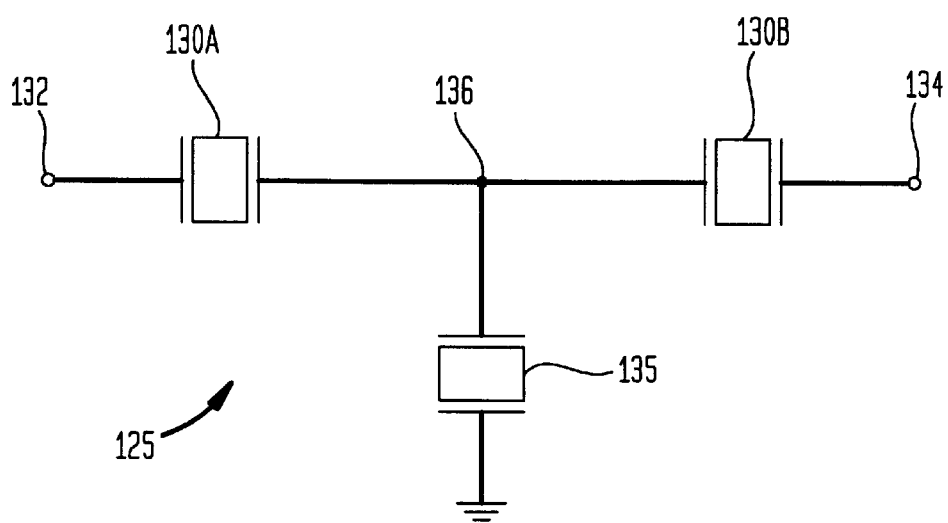
FIG. 2 illustrates a T-Cell block used in a conventional TFR ladder filter.
Figure 3A:
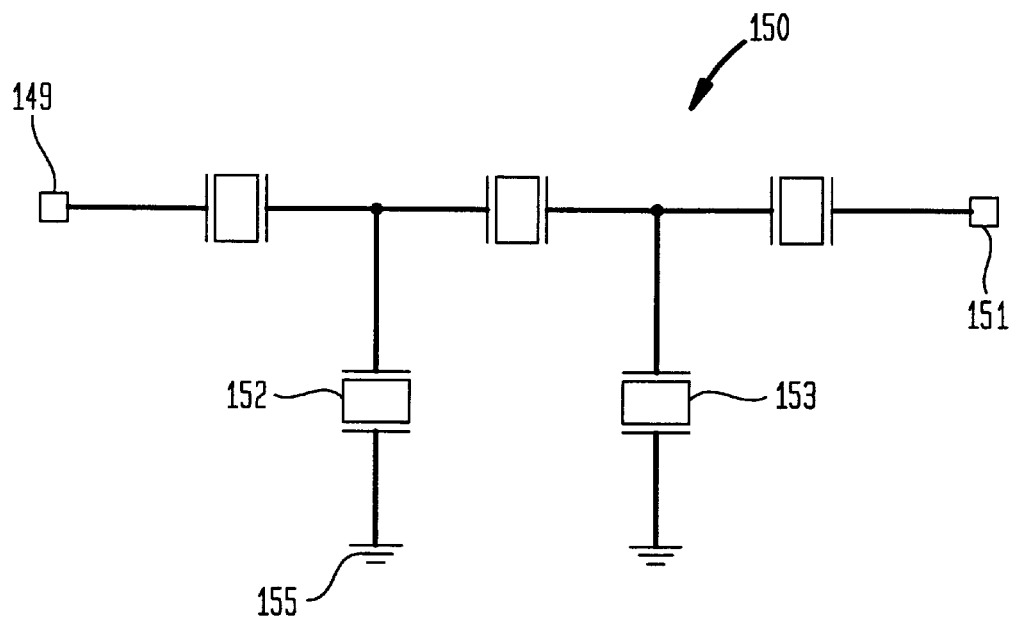
FIG. 3A illustrates a TFR ladder filter circuit with an ideal grounding arrangement.
Figure 3B:
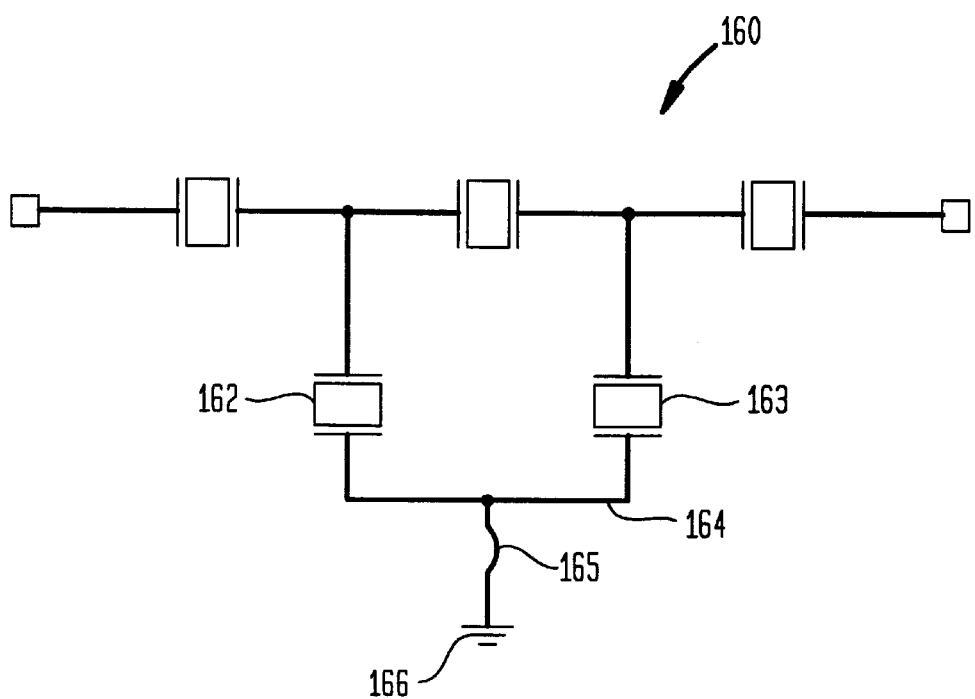
FIG. 3B illustrates a TFR ladder filter circuit with a single wirebond grounding arrangement.
Figure 7:
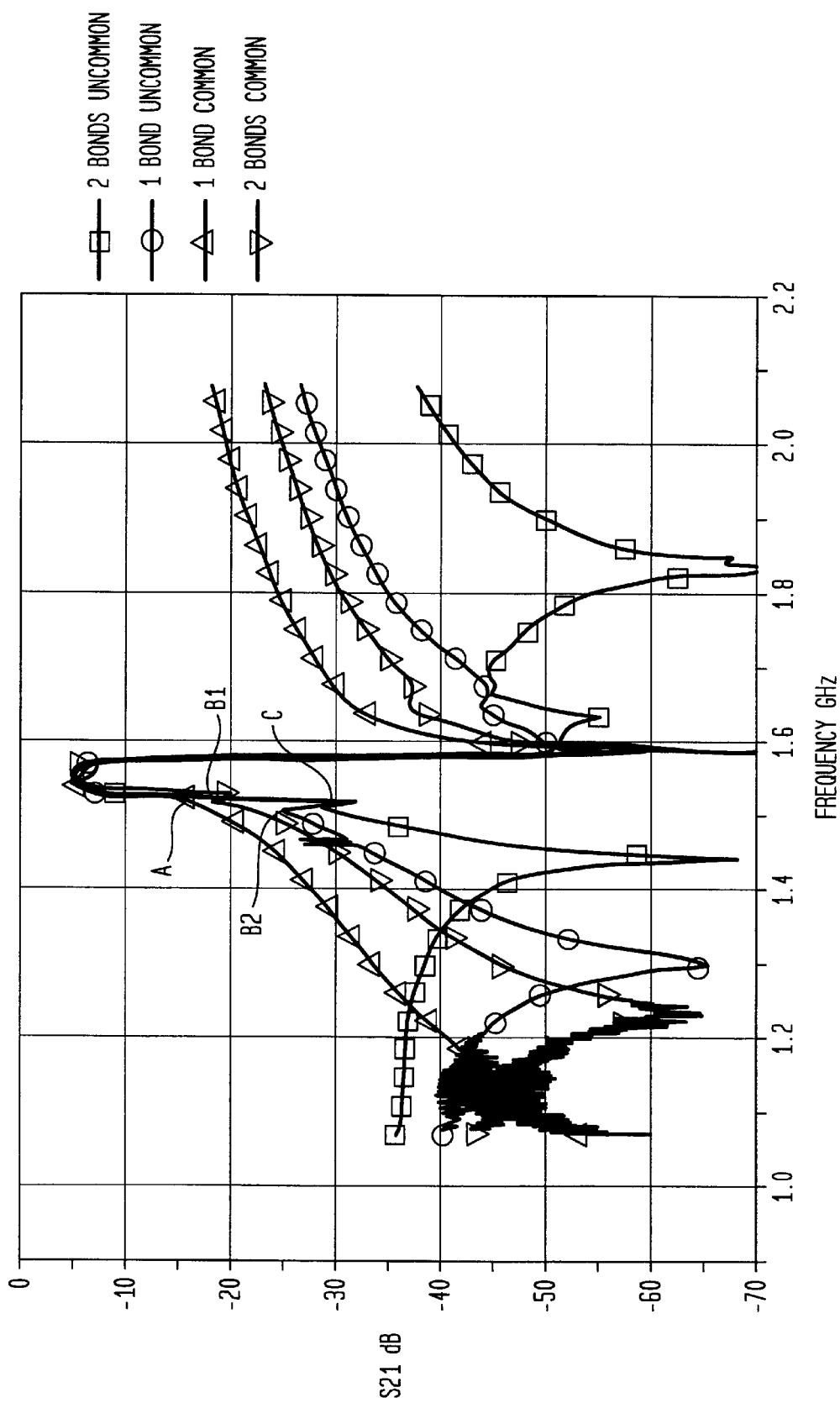
FIG. 7 illustrates the passband response characteristics for the TFR filter circuit of the present invention and the grounding arrangements of FIGS. 3A, 3B and 4A.

FIG. 7 illustrates a comparison of the passband response for the TFR filter circuit of the embodiment with the grounding arrangements of FIGS. 3A, 3B and 4A. Specifically, FIG. 7 depicts the passband performance in dB (y-axis) vs. unit frequency (x-axis, 0.05 GHz/div.) for a TFR filter circuit having: (a) the single-wirebond grounding arrangement from a common die ground first illustrated in FIG. 3B (denoted as one bond common in the key of FIG. 7); (b) a multiple-wirebond grounding from a common die ground (illustrated as "two bonds common" in the key of FIG. 7); and (c) a shunt resonator divided into separate elements, each having an individual shunt top ground electrode and corresponding wirebond connected to an external final ground, as illustrated in FIG. 6 (denoted as "one bond uncommon" in the key of FIG. 7).

The "shoulders" of each of the respective responses in FIG. 7 are labeled as A, B1, B2 and C to denote the edges of the passband and to illustrate the distinction between the out-of-band rejection characteristics obtainable by the various grounding arrangements. In the case where there is a common die or filter with only one wirebond connected to the external ground, the out-of-band rejection characteristics are poor (see point "A" to the left of the passband). Adding multiple wirebonds to the common die ground somewhat improves the out-of-band rejection characteristics. This is the circuit shown in FIGS. 4A and 4B, and illustrates improved out-of-band rejection at point B1, as compared to that obtained with a single wirebond extending from a common ground.

However, in accordance with the present invention, the out-of-band response at the passband edges may be even further improved over that attained with the multiple wirebonding arrangement of FIGS. 4A and 4B. This response "one bond uncommon" is a response corresponding to the circuit structure of FIG. 6, where the previously common shunt die ground electrode has been divided into individual shunt top grounds, each having its own wirebond to an external final ground on a carrier or package. Referring to point B2 in FIG. 7, it is evident that the out-of-band rejection characteristics are remarkably improved over that obtainable with the use of two or more wirebonds from a common die. The response labeled as "two bonds uncommon" in FIG. 7 illustrates a further improvement to the circuit of FIG. 6, illustrating the response for a filter circuit that has added a second wirebond from each divided shunt top ground electrode to the final external ground on the carrier package.

Therefore, the TFR ladder filter of the present invention allows for improved stopband response near the passband edge, as compared to conventional filters having a common die grounding arrangement. The TFR filter of the present invention reduces the disadvantageous effects of coupling/feedback by providing multiple shunt die ground electrodes with corresponding wirebonds to a final external ground on a carrier or package. Moreover, the grounding arrangement of the present invention more closely approximates the response attainable by perfect grounding with isolated ground paths of the TFR ladder filter than conventional grounding arrangements. Further, the TFR ladder filter grounding arrangement of the present invention is a departure from conventional single and multiple-wirebond grounding arrangements from a common die ground, which are currently used to ground TFR ladder filter circuits to a carrier or package.

The TFR filter of the present invention also provides an ideal additional circuit for connection to elements such as chip or spiral inductors, capacitors or variable capacitors. It is known that these components can be advantageously used to shape filter performance when added to input, output and/or shunt paths of the filter. If the conventional method of common die grounding is used, additional types of feedback/coupling between all shunt TFR elements and the newly added additional circuit elements can be detrimental to filter performance. However, in accordance with the filter arrangement of the present invention, desired circuit elements can be placed between the shunt top ground electrodes and its final ground, each desired circuit element isolated from the rest of the shunt elements, thereby reducing the detrimental effects of feedback/coupling.

The invention being thus described, it will be obvious that the same may be varied in many ways. Although the T-cell structure is illustrated in designing a ladder filter, the grounding method may be used in filters designed by other methods that do not use the T-Cell as a building block. Such variations are not to be regarded as a departure from the spirit and scope of the invention, and also to modifications as would be obvious to one skilled in the art or intended to be included within the scope of the following claims.

What is claimed is:

1. A thin film resonator (TFR) ladder filter, comprising:
   a plurality of serially-coupled TFR elements provided in a die, each serially-coupled TFR element including an upper metal electrode and a lower metal electrode;
   a plurality of shunt-coupled TFR elements provided on said die, each shunt-coupled TFR element including an upper metal ground electrode and a lower metal electrode, wherein said upper metal ground electrode of each shunt-coupled TFR element includes a separate dedicated path to a final external ground so that each shunt-coupled TFR element can be individually isolated from one another in the ladder filter.

2. The ladder filter of claim 1, wherein a corresponding wirebond connects said upper metal ground electrode of each shunt-coupled TFR element to the final external ground.

3. The ladder filter of claim 2, wherein said die rests on a carrier or package that includes said external ground.

4. The ladder filter of claim 1, wherein said final external ground is on a carrier or package upon which said die rests.

5. The ladder filter of claim 1, wherein each corresponding dedicated die ground path is isolated from die ground paths of the other shunt-coupled TFR elements in the ladder filter.

6. The ladder filter of claim 1, wherein said upper and lower electrodes are thin film metallic members of aluminum or other conductors.

7. The ladder filter of claim 1, said upper and lower electrodes having an active piezoelectric material interposed therebetween, said piezoelectric material selected from the group comprising at least ZnO, CdS and AlN.

8. The ladder filter of claim 1, wherein a corresponding circuit element connects said upper metal ground electrode of each shunt-coupled TFR element to the final external ground.

9. The ladder filter of claim 8, wherein said circuit element is selected from the group comprising at least spiral inductors or chip inductors.

10. A method of grounding a ladder filter composed of a plurality of serially-coupled thin film resonator (TFR) elements on a die, each pair of the plurality of serially-coupled TFR elements having a TFR element coupled in shunt therebetween, thus forming a plurality of adjacently shunt-coupled TFR elements in the die, comprising:
    connecting each adjacently shunt-coupled TFR element to a final ground which is external to the ladder filter; and
    isolating each of said adjacently shunt TFR elements from one another so that each has a separate dedicated path to said final external ground.

11. The method of claim 10, further including connecting at least one corresponding wirebond from each of said adjacently shunt TFR elements individually to said final external ground.

12. The method of claim 10, wherein said die rests on a carrier or package that includes said external ground.

13. The method of claim 10, further including connecting at least one corresponding circuit element from each of said adjacently shunt TFR elements individually to said final external ground.

14. The method of claim 13, wherein said circuit element is selected from the group comprising at least spiral inductors or chip inductors.

15. A method of grounding a ladder filter, comprising;

providing a plurality of serially-coupled thin film resonator (TFR) elements on a die, wherein each serially-coupled TFR element includes an upper and lower metal electrode;

providing a shunt TFR element between pairs of said plurality of serially-coupled TFR elements, thus forming a plurality of adjacently shunt-coupled TFR elements in the die, wherein each adjacently shunt-coupled TFR element includes an upper ground metal electrode and a lower metal electrode;

connecting each upper metal ground electrode of said adjacently shunt-coupled TFR element to a final ground which is external to the ladder filter; and isolating each of said adjacently shunt-coupled TFR elements from one another so that each has a separate dedicated path to said final external ground.

16. The method of claim 15, further including connecting at least one corresponding circuit element from each of said adjacently shunt TFR elements individually to said final external ground.

17. The method of claim 16, wherein said circuit element is selected from the group comprising at least spiral inductors or chip inductors.

* * * * *